United States Patent
Zhao et al.

(10) Patent No.: US 11,320,932 B2
(45) Date of Patent: May 3, 2022

(54) TOUCH DISPLAY PANEL AND METHOD FOR MANUFACTURING THE SAME, DISPLAY DEVICE

(71) Applicant: BOE TECHNOLOGY GROUP CO., LTD., Beijing (CN)

(72) Inventors: Detao Zhao, Beijing (CN); Pengcheng Lu, Beijing (CN); Liang Chen, Beijing (CN); Ning Cong, Beijing (CN); Ming Yang, Beijing (CN); Dongni Liu, Beijing (CN); Li Xiao, Beijing (CN); Shengji Yang, Beijing (CN); Lei Wang, Beijing (CN); Minghua Xuan, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 276 days.

(21) Appl. No.: 16/496,236

(22) PCT Filed: Apr. 22, 2019

(86) PCT No.: PCT/CN2019/083697
§ 371 (c)(1),
(2) Date: Sep. 20, 2019

(87) PCT Pub. No.: WO2019/206083
PCT Pub. Date: Oct. 31, 2019

(65) Prior Publication Data
US 2021/0333969 A1    Oct. 28, 2021

(30) Foreign Application Priority Data
Apr. 26, 2018 (CN) .......................... 201810385431.2

(51) Int. Cl.
*G06F 3/041* (2006.01)
*H01L 27/32* (2006.01)

(52) U.S. Cl.
CPC ........ *G06F 3/04164* (2019.05); *G06F 3/0412* (2013.01); *H01L 27/323* (2013.01); *G06F 2203/04103* (2013.01)

(58) Field of Classification Search
CPC .... G06F 3/0412; H01L 27/323; G09G 3/0443
See application file for complete search history.

(56) References Cited

U.S. PATENT DOCUMENTS

| | | | |
|---|---|---|---|
| 6,570,323 B1 * | 5/2003 | Nakamata | H01L 27/3283 313/500 |
| 2008/0074041 A1 * | 3/2008 | Nakayama | H01L 27/3246 313/504 |

(Continued)

FOREIGN PATENT DOCUMENTS

| | | |
|---|---|---|
| CN | 103389824 A | 11/2013 |
| CN | 104360524 A | 2/2015 |

(Continued)

OTHER PUBLICATIONS

First Office Action dated Oct. 9, 2019, for corresponding Chinese application 201810385431.2.

*Primary Examiner* — Sanjiv D. Patel
(74) *Attorney, Agent, or Firm* — Nath, Goldberg & Meyer; Joshua B. Goldberg (57) ABSTRACT

A touch display panel and a method for manufacturing the same are provided. The method includes: forming touch lines, an insulating layer and first electrodes above a substrate, the insulating layer covers the touch lines and is provided with at least one through-hole, the first electrodes are at a side of the insulating layer distal from the touch lines; forming barrier walls in each through-hole, and at a predetermined position in an interval between the first electrodes; forming a light emitting layer and a second electrode layer at a side of the light emitting layer distal from the substrate; removing the barrier walls, portions of the (Continued)

light emitting layer and the second electrode layer above the barrier walls, remaining portions of the second electrode layer form touch electrodes; forming an electrical conductive structure in each through-hole for coupling one touch line to one touch electrode.

12 Claims, 5 Drawing Sheets

(56) References Cited

U.S. PATENT DOCUMENTS

| | | | |
|---|---|---|---|
| 2013/0293499 A1 | 11/2013 | Chang et al. | |
| 2015/0062457 A1 | 3/2015 | Kida et al. | |
| 2016/0370891 A1 | 12/2016 | Zhang et al. | |
| 2017/0060302 A1* | 3/2017 | Yang | G06F 3/0412 |
| 2017/0147121 A1* | 5/2017 | Yang | H01L 27/3246 |
| 2018/0309086 A1 | 10/2018 | Li et al. | |
| 2018/0356690 A1 | 12/2018 | Yu et al. | |
| 2019/0035857 A1 | 1/2019 | Cao | |
| 2019/0326359 A1 | 10/2019 | Yang et al. | |

FOREIGN PATENT DOCUMENTS

| | | |
|---|---|---|
| CN | 104898884 A | 9/2015 |
| CN | 205353991 U | 6/2016 |
| CN | 106773334 A | 5/2017 |
| CN | 106875851 A | 6/2017 |
| CN | 107068720 A | 8/2017 |
| CN | 107123621 A | 9/2017 |
| CN | 107272958 A | 10/2017 |
| CN | 107359182 A | 11/2017 |
| CN | 107704129 A | 2/2018 |
| CN | 108415614 A | 8/2018 |
| WO | 2013145958 A1 | 10/2013 |

* cited by examiner

TOUCH DISPLAY PANEL AND METHOD FOR MANUFACTURING THE SAME, DISPLAY DEVICE

CROSS-REFERENCE TO RELATED APPLICATIONS

This is a National Phase Application filed under 35 U.S.C. 371 as a national stage of PCT/CN2019/083697, filed Apr. 22, 2019, an application claiming the benefit of Chinese Patent Application No.201810385431.2, filed on Apr. 26, 2018, the contents of each of which is hereby incorporated by reference in its entirety.

TECHNICAL FIELD

The present disclosure relates to the field of touch technology, and in particular, to a touch display panel and a method for manufacturing the touch display panel, and a display device.

BACKGROUND

Active matrix organic light emitting diode (AMOLED) display panels are also known as organic light emitting diode (OLED) display panels, and are applied widely due to their advantages such as low cost, fast response, power saving, wide operating temperature range and easy realization of flexibility.

In an OLED display panel, a touch structure (e.g., touch film layer) may be provided in a packaging structure (such as packaging layer, packaging film, etc.) for packaging an OLED, which forms a multilayer-on-cell touch structure. However, the multilayer-on-cell touch structure has a complex structure and a high cost.

For using an in-cell touch structure in the OLED display panel, an electrode (e.g., cathode) of the OLED distal from a substrate may be divided into a plurality of blocks, each of which is also used as a touch electrode by time division multiplexing. Obviously, the touch electrode needs to be coupled to a driving chip through a touch lead wire, however, due to technological constraints, a light emitting layer of the OLED can only be a complete layer, and it is difficult to form through-holes therein, which results in that the touch lead wire located below the light emitting layer cannot be coupled to the touch electrode above the light emitting layer, and the touch lead wire can only be provided in the same layer as the touch electrode (e.g., cathode). Moreover, due to process requirements, the touch electrode and a touch lead wire in a same layer can only be located in different positions because they cannot overlap with each other. Therefore, the touch electrode has a small coverage range and a large touch blind area is caused.

SUMMARY

According to embodiments of the present disclosure, a method for manufacturing a touch display panel is provided. The method includes: forming a plurality of touch lines, an insulating layer and a plurality of first electrodes above a surface of a side of a substrate, the insulating layer covers the touch lines and is provided with at least one through-hole corresponding to each of the touch lines, each through-hole exposes a portion of the touch line corresponding thereto, the first electrodes arranged in rows and columns and spaced apart from each other are at a side of the insulating layer distal from the touch lines, and orthographic projections of the touch lines on the substrate do not overlap with orthographic projections of the first electrodes on the substrate; forming barrier walls in each through-hole, and at a predetermined position, at which no touch electrode is to be formed, in an interval between the first electrodes, each of the barrier walls has a thickness greater than a predefined threshold in a direction perpendicular to the surface of the substrate; forming a light emitting layer and a second electrode layer at the side of the substrate formed with the touch lines, the insulating layer, the first electrodes and the barrier walls, the second electrode layer is formed at a side of the light emitting layer distal from the substrate, portions of the light emitting layer formed above the barrier walls and portions of the second electrode layer formed above the barrier walls disconnect from remaining portions of the light emitting layer and remaining portions of the second electrode layer respectively; removing the barrier walls, the portions of the light emitting layer formed above the barrier walls and the portions of the second electrode layer formed above the barrier walls, the remaining portions of the second electrode layer form a plurality of touch electrodes arranged in rows and columns and spaced from each other, each of the first electrodes, the light emitting layer in contact with said each of the first electrodes and the touch electrode in contact with the light emitting layer form an organic light emitting diode; forming an electrical conductive structure in each through-hole, each electrical conductive structure couples one touch line corresponding thereto to one touch electrode corresponding to said one touch line.

In some implementations, forming the barrier walls includes: performing exposure and developing processes on photoresist to form the barrier walls, so that the barrier walls are formed of photoresist.

In some implementations, the photoresist is photodegradable photoresist.

In some implementations, removing the barrier walls includes: applying light radiation to the barrier walls so that the barrier walls are separated from the substrate.

In some implementations, during applying the light radiation to the barrier walls, a wind shower process is further performed on the barrier walls by blowing inert gas to the barrier walls.

In some implementations, the photodegradable photoresist includes: photoresist base material and photo-degradation catalyst doped in the photoresist base material.

In some implementations, the photo-degradation catalyst is titanium dioxide.

In some implementations, each of the barrier walls has a thickness greater than or equal to 1000 nm in a direction perpendicular to the surface of the substrate.

In some implementations, the touch lines extend parallel with each other.

In some implementations, each of the rows of the first electrodes or each of the columns of the first electrodes has a direction parallel with a direction in which the touch lines extend.

In some implementations, each of the barrier walls includes a portion extending parallel with the direction in which the touch lines extend and a portion extending perpendicular to the direction in which the touch lines extend.

In some implementations, in a cross section, perpendicular to a direction in which the barrier walls extend, of at least one of the barrier walls, the at least one of the barrier walls has a width in a direction parallel to the surface of the substrate, which increases as distant from the substrate.

In some implementations, forming the electrical conductive structure in each through-hole includes: coating metal powder in each through-hole to form the electrical conductive structure.

According to embodiments of the present disclosure, a touch display panel is provided. The touch display panel includes: a substrate; a plurality of touch lines provided above a surface of a side of the substrate; an insulating layer provided at a side of the touch lines distal from the substrate, the insulating layer covers the touch lines and is provided with at least one through-hole corresponding to each of the touch lines, each through-hole exposes a portion of the touch line corresponding thereto; a plurality of first electrodes provided at a side of the insulating layer distal from the substrate, the first electrodes are arranged in rows and columns and spaced apart from each other, and orthographic projections of the touch lines on the substrate do not overlap with orthographic projections of the first electrodes on the substrate; a plurality of touch electrodes provided at a side of the first electrodes distal from the substrate, the touch electrodes are arranged in rows and columns and spaced apart from each other; a light emitting layer provided between the touch electrodes and the first electrodes, an orthographic projection of the light emitting layer on the substrate completely overlap with orthographic projections of the touch electrodes on the substrate, each through-hole penetrates through the light emitting layer and the touch electrode corresponding thereto, each of the first electrodes, the light emitting layer in contact with said each of the first electrodes and the touch electrode in contact with the light emitting layer form an organic light emitting diode; a plurality of electrical conductive structures, which are formed in through-holes in one-to-one correspondence, each electrical conductive structure couples one touch line corresponding thereto to one touch electrode corresponding to said one touch line.

In some implementations, the touch lines extend parallel with each other.

In some implementations, each of the rows of the first electrodes or each of the columns of the first electrodes has a direction parallel with a direction in which the touch lines extend.

According to embodiments of the present disclosure, a display device is provided. The display device includes the touch display panel described above.

DESCRIPTION OF EMBODIMENTS

In order to make a person skilled in the art understand technical solutions of the present disclosure better, the present disclosure will be described in detail below in conjunction with accompanying drawings and specific embodiments.

In the present disclosure, two structures being provided in a single/same layer means that the two structures are formed of a same material layer, thus they are in the single/same layer in a stacking relationship, but it does not mean that they are at a same distance from a same reference object, nor that other layer structures between one of them and the same reference object are identical to those between the other of them and the same reference object.

In the present disclosure, "above" and "below" are relative. If a structure A is farther away from the substrate than a structure B, the structure A is above the structure B and the structure B is below the structure A.

Figure 1:
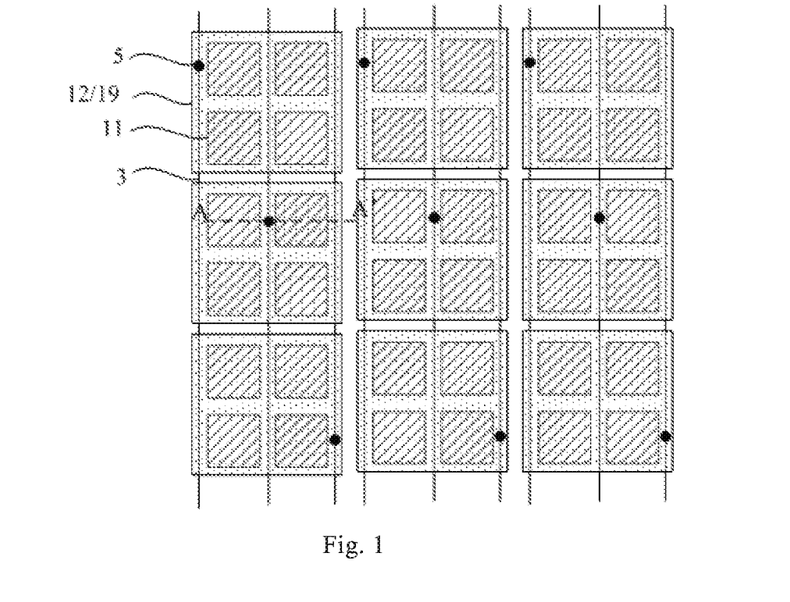
FIG. 1 shows a top view of a structure of a touch display panel in an embodiment of the present disclosure.
Figure 2:
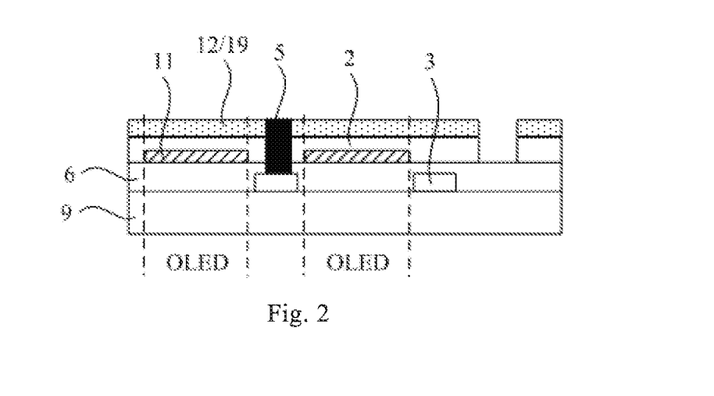
FIG. 2 shows a partial cross section view of the structure shown in FIG. 1, which is taken along line AA' in FIG. 1.

FIGS. 1 and 2 show a touch display panel manufactured by a method for manufacturing a touch display panel in an embodiment of the present disclosure. Herein, the touch display panel may refer to a display panel with touch function, and in particular, may refer to an OLED display panel with touch function. That is to say, each sub-pixel of the touch display panel may include an OLED for emitting light.

Figure 9:
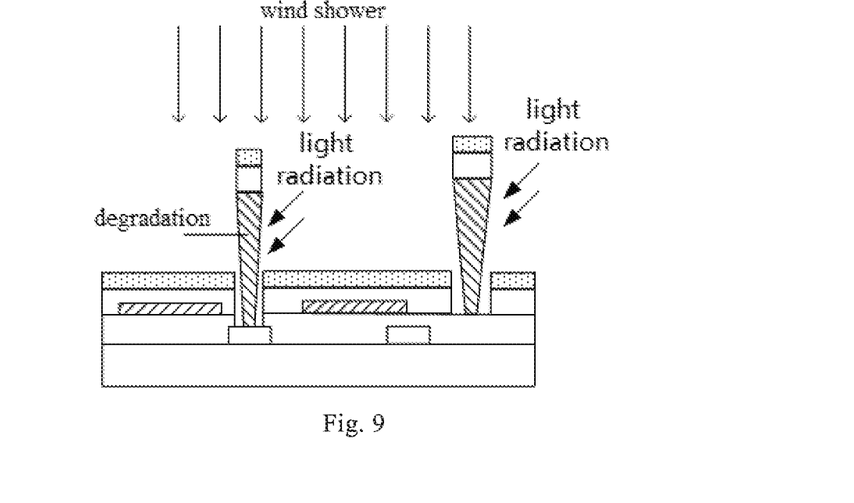
FIG. 9 shows a principle diagram for removing the barrier walls in an embodiment of the present disclosure.
Figure 10:
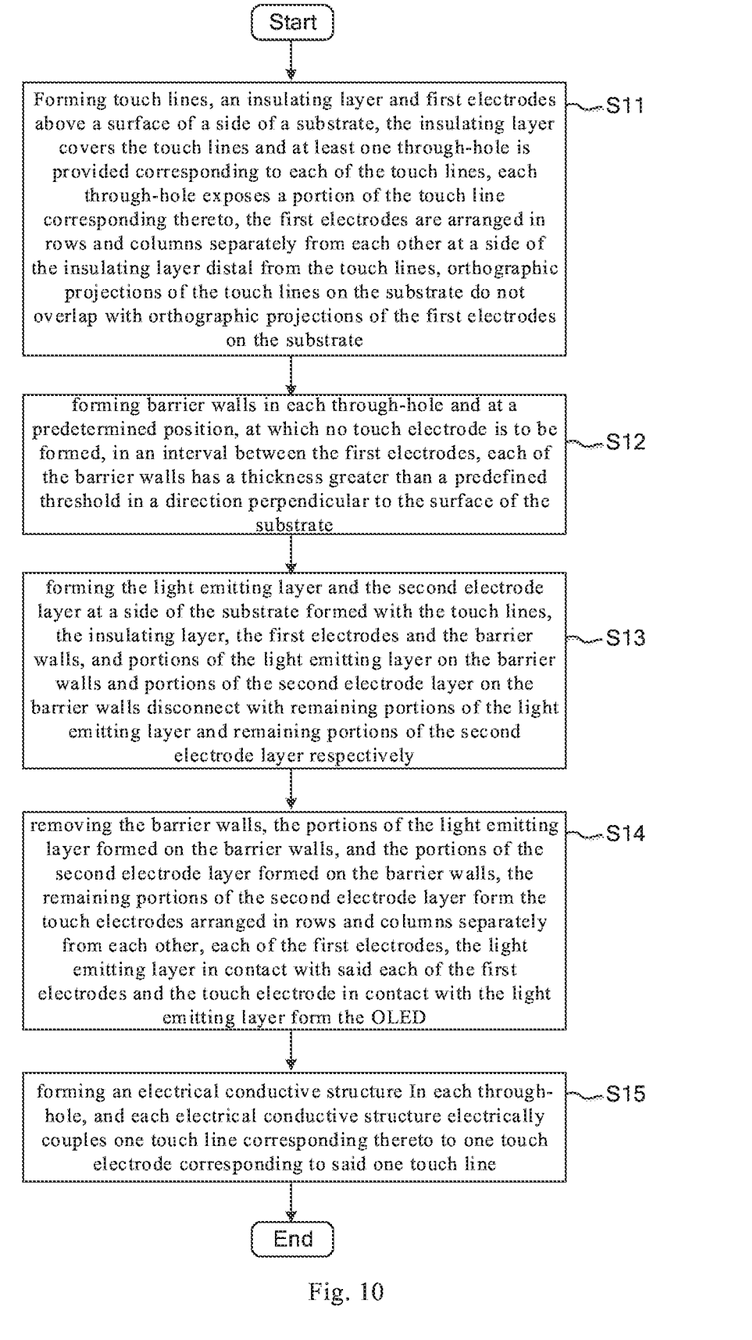
FIG. 10 shows a method for manufacturing a touch display panel in an embodiment of the present disclosure.

As show in FIG. 10, the method for manufacturing the touch display panel in the embodiment of the present disclosure may include following steps S11 through S15. The method for manufacturing the touch display panel in the embodiment of the present disclosure may be described in detail below by referring to FIGS. 1 through 9.

Figure 3:
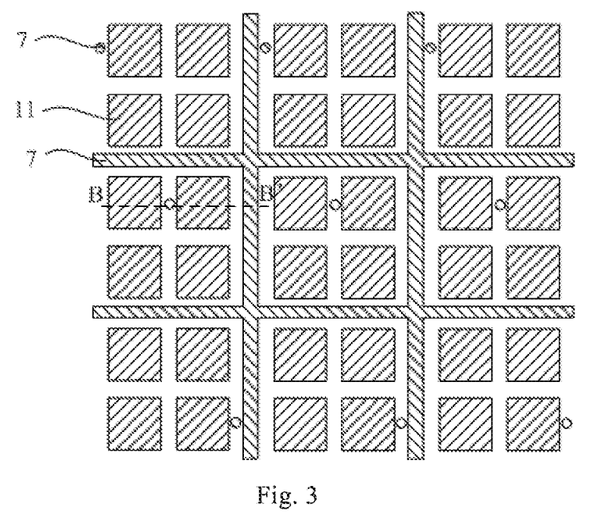
FIG. 3 shows a top view of a structure formed with barrier walls by a method for manufacturing a touch display panel in an embodiment of the present disclosure.
Figure 4:
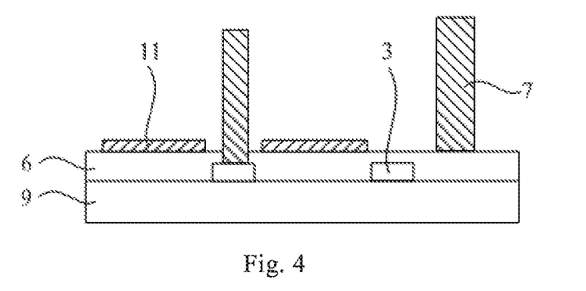
FIG. 4 shows a partial cross section view of the structure shown in FIG. 3, which is taken along line BB' in FIG. 3.

At step S11, as shown in FIGS. 3 and 4, a plurality of touch lines 3, an insulating layer 6 and a plurality of first electrodes 11 are formed above a surface of a side of a substrate 9. The insulating layer 6 covers the touch lines and is provided with at least one through-hole 8 therein corresponding to each of the touch lines 3. Each through-hole 8 exposes a portion of the touch line 3 corresponding thereto. The first electrodes 11, which are arranged in rows and columns and spaced apart from each other, are provided at a side of the insulating layer 6 distal from the touch lines 3. Orthographic projections of the touch lines 3 on the substrate 9 do not overlap with orthographic projections of the first electrodes 11 on the substrate 9.

In some implementations, the touch lines 3 extend parallel with each other.

In some implementations, each of the rows of the first electrodes 11 or each of the columns of the first electrodes 11 has a direction parallel with a direction in which the touch lines 3 extend.

That is to say, each sub-pixel is formed with one first electrode 11 separately as an electrode (e.g., anode) of an OLED. The touch lines 3 are insulated from the first electrodes 11, for example, the touch lines 3 are arranged in intervals between the first electrodes 11, and at least one insulating layer 6 is provided between the touch lines 3 and the first electrodes 11.

Moreover, the insulating layer 6 also makes the touch lines 3 be not in contact with a light emitting layer 2 to be formed subsequently. In order to make the touch lines 3 electrically connect with touch electrodes 19 to be formed subsequently, at least one through-hole 8 may be provided in the insulating layer 6 corresponding to each of the touch lines 3.

Since the first electrodes 11 need to be in contact with the light emitting layer 2 to be formed subsequently to form the OLED, no insulating layer should be provided above the first electrodes 11.

Before performing the step S12, a driving structure may be formed above the substrate 9 for driving sub-pixels (i.e., providing driving signals to the first electrodes 11). The driving structure may include elements such as a gate line, a data line and a pixel circuit which may include a plurality of transistors and capacitors, no detailed description will be provided here. The touch lines 3 and the insulating layer 6 may be provided in layers the same as those in which some of the elements of the driving structure are provided, and formations of the touch lines 3 and the insulating layer 6 may be synchronous with formations of some of the elements of the driving structure. For example, the touch lines 3 may be provided in a layer the same as that in which the gate line or the data line is provided, and the insulating layer 6 may also be used as a gate insulating layer of the transistors, which will not be described in detail here.

At step S12, as shown in FIGS. 3 and 4, barrier walls 7 are provided in each through-hole 8, and at a predetermined position, at which no touch electrode is to be formed, in an interval between the first electrodes 11. Each of the barrier walls 7 has a thickness greater than a predefined threshold in a direction perpendicular to the surface of the substrate 9.

As shown in FIGS. 3 and 4, each of the through-holes 8 (corresponding to the respective touch lines 3) is provided with the barrier wall 7 therein, and the predetermined position, at which no touch electrode is to be formed, in the interval between the first electrodes 11 is also provided with the barrier wall 7. That is, the barrier walls 7 are provided at predetermined positions at which no touch electrode is to be formed.

Each of the touch electrodes 19 is simultaneously used as an electrode (e.g., cathode) of the OLED in one of the sub-pixels. The predetermined position, at which no touch electrode 19 is to be formed, in the interval between the first electrodes 11 is also in an interval between the sub-pixels.

In some implementations, the step S12 may further include: performing exposure and developing processes on photoresist to form the barrier walls 7 so that the barrier walls 7 are formed of photoresist.

That is to say, the barrier walls 7 may be obtained by using photoresist as raw material and performing exposure and developing processes on the photoresist. Thus, the barrier walls 7 are formed of photoresist. Compared with forming the barrier walls 7 by other materials, it is not necessary to perform processes such as etching process while forming the barrier walls 7 by photoresist, a procedure for manufacturing the touch display panel is simplified.

In some implementations, the photoresist may be photodegradable photoresist.

In some implementations, the photodegradable photoresist may include photoresist base material and photo-degradation catalyst doped in the photoresist base material.

In some implementations, the photo-degradation catalyst may be titanium dioxide ($TiO_2$).

That is to say, the photodegradable photoresist with a property of photo-degradation under light illumination may be formed by adding photo-degradation catalyst such as titanium dioxide into conventional photoresist. The specific role of the photodegradable photoresist for forming the barrier walls 7 will be described later.

In some implementations, each of the barrier walls 7 has a thickness (e.g., 1500 nm) greater than or equal to 1000 nm in a direction perpendicular to the surface of the substrate 9. That is to say, each of the barrier walls 7 can ensure that each of the light emitting layer 2 and the second electrode layer 12 to be formed is disconnected only when each of the barrier walls 7 has the thickness as above, which will be described in detail later.

In some implementations, each of the barrier walls 7 includes a portion extending parallel with the direction in which the touch lines 3 extend and a portion extending perpendicular to the direction in which the touch lines 3 extend.

In some implementations, in a cross section, perpendicular to a direction in which the barrier walls 7 extend, of at least one of the barrier walls 7, the at least one of the barrier walls 7 has a width in a direction parallel to the surface of the substrate 9, which increases as distant from the substrate 9.

That is to say, in some implementations, the cross section, perpendicular to the direction in which the barrier walls 7 extend, of the at least one of the barrier walls 7 is of an inverted trapezoidal shape with a long upper side and a short lower side (i.e., the trapezoidal shape has a long top side and a short bottom side), as shown in FIG. 9. Thus, when the light emitting layer 2 and the second electrode 12 are formed subsequently, under a cutting function of an angle between a top surface and a side surface of each of the barrier walls 7, it is easy to disconnect each of the light emitting layer 2 and the second electrode layer 12.

In some implementations, the barrier walls 7 are formed of photoresist which is non-degradable after exposure, thus the barrier walls 7 are naturally formed as the inverted trapezoidal shape by processes such as exposure and developing. Specifically, the barrier walls 7 are irradiated by light from above in a direction perpendicular to a top surface of the substrate, thus an intensity of light arriving at a portion of each of the barrier walls 7 proximal to the substrate is reduced. That is to say, the portion of each of the barrier walls 7 proximal to the substrate is exposed at a low extent, and much photoresist is degraded, thus the portion of each of the barrier walls 7 proximal to the substrate has little remaining photoresist and a small width after a degradation process. By contrast, if the barrier walls 7 are formed of photoresist which is degradable after exposure, the barrier walls 7 need to be irradiated by light from below. In the embodiment, a wavelength of light leading to degradation of the barrier walls 7 may be different from a wavelength of light leading to non-degradation of the barrier walls 7.

Figure 5:
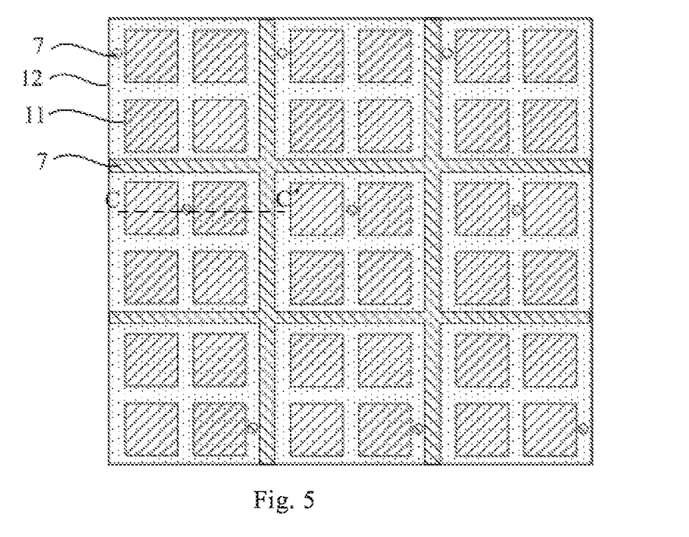
FIG. 5 shows a top view of a structure formed with a second electrode layer by a method for manufacturing a touch display panel in an embodiment of the present disclosure.
Figure 6:
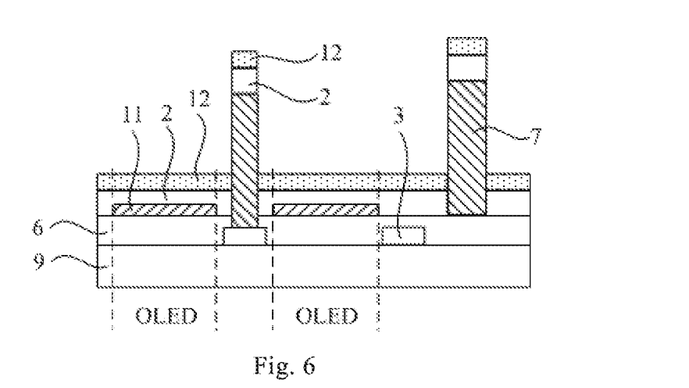
FIG. 6 shows a partial cross section view of the structure shown in FIG. 5, which is taken along line CC' in FIG. 5.

At step S13, as shown in FIGS. 5 and 6, the light emitting layer 2 and the second electrode layer 12 are formed at a side of the substrate 9 formed with the touch lines 3, the insulating layer 6, the first electrodes 11 and the barrier walls 7, and the second electrode layer 12 is formed at a side of the light emitting layer 2 distal from the substrate 9. Portions of the light emitting layer 2 on the barrier walls 7 and portions of the second electrode layer 12 on the barrier walls 7 disconnect with remaining portions of the light emitting layer 2 and remaining portions of the second electrode layer 12 respectively. Each of the first electrodes 11, the light emitting layer 2 in contact with said each of the first electrodes 11 and the second electrode layer 12 in contact with the light emitting layer 2 form an organic light emitting diode.

In the embodiment, the light emitting layer 2 and the second electrode layer 12 (e.g., cathode) covering the light emitting layer 2 are formed by conventional processes (e.g. evaporation plating) for forming an OLED and conventional materials for forming the OLED. A total thickness of the light emitting layer 2 and the second electrode layer 12 is usually tens of nanometers, for example, 50 nanometers. In some implementations, the light emitting layer 2 may include many sub-layers such as a hole injection layer, a hole transport layer, an electron injection layer, an electron transport layer, a light emitting material layer.

As shown in FIGS. 5 and 6, the thickness of each of the barrier walls 7 is much greater than the total thickness of the light emitting layer 2 and the second electrode 12. For example, as described above, the thickness of each of the barrier walls 7 may be 1500 nm and the total thickness of the light emitting layer 2 and the second electrode 12 may be 50 nm. Thus, when the light emitting layer 2 and the second electrode layer 12 are formed, the portions of the light emitting layer 2 on the barrier walls 7 and the portions of the second electrode layer 12 on the barrier walls 7 certainly disconnect from the remaining portions of the light emitting layer 2 and the remaining portions of the second electrode layer 12 respectively. In the embodiment, each of the first electrodes 11 is directly in contact with the light emitting layer 2, and the light emitting layer 2 is directly in contact with the second electrode layer 12, so that the OLED is formed. Therefore, the touch display panel is substantially a touch display panel having an array of organic light emitting diodes, and each sub-pixel is provided with one of the organic light emitting diodes therein for emitting light.

Figure 7:
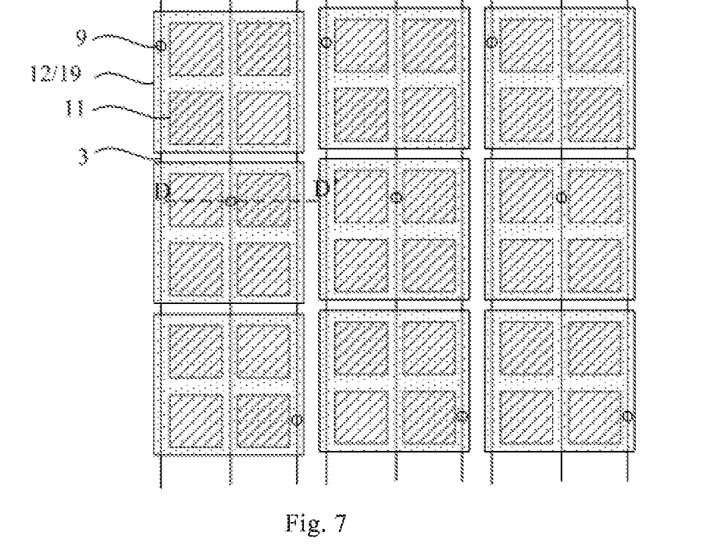
FIG. 7 shows a top view of a structure in which the barrier walls are removed by a method for manufacturing a touch display panel in an embodiment of the present disclosure.
Figure 8:
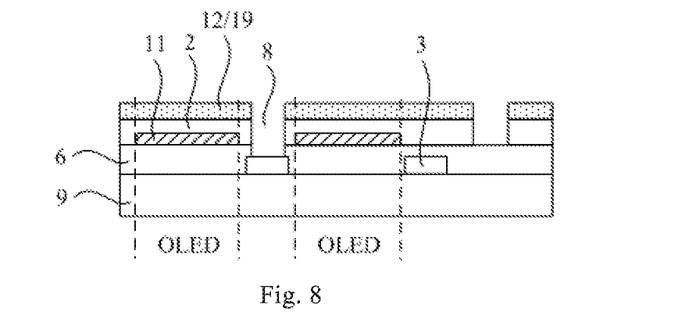
FIG. 8 shows a partial cross section view of the structure shown in FIG. 7, which is taken along line DD' in FIG. 7.

At step S14, as shown in FIGS. 7 and 8, the barrier walls 7, the portions of the light emitting layer 2 formed on the barrier walls 7, and the portions of the second electrode layer 12 formed on the barrier walls 7 are removed. Thus, the remaining portions of the second electrode layer 12 form the touch electrodes 19 arranged in rows and columns and spaced apart from each other.

In the embodiment, as described above, each of the first electrodes 11, the light emitting layer 2 in contact with said each of the first electrodes 11 and the touch electrode 19 in contact with the light emitting layer 2 form the OLED.

As shown in FIGS. 7 and 8, while removing the barrier walls 7, the portions of the light emitting layer 2 formed above the barrier walls 7 and the portions of the second electrode layer 12 formed above the barrier walls 7 are certainly removed. In the top view of FIG. 7, the remaining portions of the light emitting layer 2 and the remaining portions of the second electrode layer 12 have a same shape with each other. In the embodiment, as shown in FIGS. 7 and 8, the remaining portions of the second electrode layer 12 are divided into a plurality of blocks, each of the blocks is formed as one of the touch electrodes 19, and each of the touch electrodes 19 corresponds to at least one of the first electrodes 11. As shown in FIGS. 7 and 8, each of the touch electrodes 19 is provided with at least one through-hole 8, the at least one through-hole 8 penetrates through said each of the touch electrodes 9, the light emitting layer 2 and the insulating layer 6 to reach the touch line 3 corresponding to said each of the touch electrodes 19.

In some implementations, when the barrier walls 7 are formed of photoresist which is photodegradable, the step S14 may further include: applying light radiation to the barrier walls 7 so that the barrier walls 7 are separated from the substrate 9. That is to say, as shown in FIG. 9, when the barrier walls 7 are formed of photoresist which is photodegradable, the barrier walls 7 may be radiated by light, so that the barrier walls 7 can be degraded, aging and denatured rapidly, thereby an adhesion of the barrier walls 7 to the touch lines 3 and the insulating layer 6 becomes poor, and the barrier walls 7 are separated from the substrate 9. In some implementations, since the thickness of each of the barrier walls 7 is large, and the width of each of the barrier walls 7 is small (since each gap between the touch electrodes 19 is generally small), the light for degrading the barrier walls 7 can transmit through the second electrode layer 12 and the light emitting layer 2 to irradiate to the barrier walls 7, and can directly irradiate the barrier walls 7 from sides of the barrier walls 7, so that the degradation effect can be ensured.

In some implementations, during applying the light radiation to the barrier walls 7, a wind shower process may be further performed on the barrier walls 7 by blowing inert gas (e.g., nitrogen) to the barrier walls 7, to accelerate the barrier walls 7 separating from the substrate 9.

In such way, the barrier walls 7 can be removed by using only light and inert gas, instead of chemical reagents such as developer, thus an influence of chemical reagents on the light emitting layer 2 can be avoided, thus improving the performance of the touch display panel finally manufactured.

At step S15, each through-hole 8 is provided with an electrical conductive structure 5 therein, and each electrical conductive structure 5 electrically couples one touch line 3 corresponding thereto to one touch electrode 19 corresponding to said one touch line 3.

In the embodiment, an orthographic projection of each of the touch electrodes 19 on the substrate 9 may overlap with orthographic projections of the first electrodes 11, corresponding to said each of the touch electrodes 19, on the substrate 9, and the orthographic projection of each of the touch electrodes 19 on the substrate 9 may partially overlap with an orthographic projection of the touch line 3, electrically coupled to each of the touch electrodes 19, on the substrate 9.

In some implementations, the touch electrodes 19 and the touch lines 3 are in one-to-one correspondence, and each of the touch electrodes 19 is electrically coupled to the touch line 3 corresponding thereto through the electrical conductive structure 5. As shown in FIG. 8, since the through-hole 8 is through from the touch electrode 19 to the touch line 3, as shown in FIGS. 1 and 2, the electrical conductive structure 5 may be formed in the through-hole 8 to electrically coupling the touch electrode 19 to the touch line 3 corresponding thereto.

In the embodiment, each of the touch electrodes 19 is a separate electrode, and is coupled to a touch chip by being electrically coupled to the touch line 3 corresponding thereto. Thus, each of the touch electrodes 19 may be a self-capacitive electrode with a self-capacitance. The touch line 3 is configured to provide a touch driving signal to the touch electrode 19 corresponding thereto, and receive a touch signal from the touch electrode 19 corresponding thereto.

In some implementations, the electrical conductive structure 5 may be formed by coating metal powder in the through-hole 8. In some implementations, the metal powder is tungsten powder. That is to say, the metal powder, such as tungsten powder, may be coated in the through-hole 8 by using a metal powder coating process of an array substrate repair technology (e.g., a technology for connecting disconnected leads), and is cured to form the electrical conductive structure 5. In such way, the electrical conductive structure 5 is formed without using chemical reagents such as etchant and conditions such as high temperature or high pressure (e.g. in processes such as sputtering, chemical vapor deposition, etc.), which can reduce an influence of external environment on the light emitting layer 2 and improve the performance of the touch display panel finally manufactured.

It should be noted that, after the steps described above, other steps such as packaging may be performed on the OLED, which will not be described in detail here.

In the method for manufacturing the touch display panel of the embodiment, before forming the light emitting layer and the second electrode layer, the barrier walls, each of which has a thickness much greater than a total thickness of the light emitting layer and the second electrode layer, are formed in advance at predetermined positions (including intervals between the first electrodes, and the through-holes), at which no touch electrode is to be formed, and after forming the light emitting layer and the second electrode layer, the barrier walls are removed so that the portions of the light emitting layer above the barrier walls and the portions of the second electrode layer above the barrier walls are also removed. Therefore, the remaining portions of the second electrode layer form the touch electrodes separated from each other. Each of the touch electrodes may be electrically coupled to the touch line corresponding thereto through the electrical conductive structure formed in the corresponding through-hole. The touch line is provided below the light emitting layer, and the touch electrode is provided above the light emitting layer. The orthographic projection of each of the touch electrodes on the substrate may partially overlap with the orthographic projection of the touch line electrically coupled to said each of the touch electrodes. Therefore, in a case where an area of the touch display panel is constant, a large touch area (i.e., a large touch electrode area) and a small non-touch area may be achieved. Furthermore, since the touch electrode is also used as an electrode (e.g., cathode) of the OLED, it is not necessary to provide separate electrodes for only touch. That is to say, the touch display panel manufactured by the method of the embodiment is an in-cell touch display panel having advantages such as simple structure and low cost.

As shown in FIGS. 1 and 2, an embodiment of the present disclosure provides a touch display panel. The touch display panel includes: a substrate 9; a plurality of touch lines 3 provided above a surface of a side of the substrate 9; an insulating layer 6 provided at a side of the touch lines 3 distal from the substrate 9, the insulating layer 6 covers the touch lines 3 and the insulating layer 6 is provided with at least one through-hole 8 corresponding to each of the touch lines 3, each through-hole 8 exposes a portion of the touch line 3 corresponding thereto; a plurality of first electrodes 11 provided at a side of the insulating layer 6 distal from the substrate 9, the first electrodes 11 are arranged in rows and columns and spaced apart from each other, and orthographic projections of the touch lines 3 on the substrate 9 do not overlap with orthographic projections of the first electrodes 11 on the substrate 9; a plurality of touch electrodes 19 provided at a side of the first electrodes 11 distal from the substrate 9, the touch electrodes 19 are arranged in rows and columns and spaced apart from each other; a light emitting layer 2 provided between the touch electrodes 19 and the first electrodes 11, an orthographic projection of the light emitting layer 2 on the substrate 9 completely overlap with orthographic projections of the touch electrodes 19 on the substrate 9, each through-hole 8 penetrates through the light emitting layer 2 and the touch electrode 19 corresponding thereto, each of the first electrodes 11, the light emitting layer 2 in contact with said each of the first electrodes 11 and the touch electrode 19 in contact with the light emitting layer 2 form an organic light emitting diode; a plurality of electrical conductive structures 5, which are formed in the through-holes 8 in one-to-one correspondence, each electrical conductive structure 5 couples one touch line 3 corresponding thereto to one touch electrode 19 corresponding to said one touch line 3.

In some implementations, the touch lines 3 extend parallel with each other. In some implementations, each of the rows of the first electrodes 11 or each of the columns of the first electrodes 11 has a direction parallel with a direction in which the touch lines 3 extend.

The touch display panel of the embodiment is manufactured by the method of above embodiment. Thus, each of the touch electrodes is electrically coupled to the touch line corresponding thereto through the electrical conductive structure formed in the corresponding through-hole. The touch line is provided below the light emitting layer, and the touch electrode is provided above the light emitting layer. The orthographic projection of each of the touch electrodes on the substrate may partially overlap with the orthographic projection of the touch line electrically coupled to said each of the touch electrodes. Therefore, in a case where an area of the touch display panel is constant, a large touch area (i.e., a large touch electrode area) and a small non-touch area may be achieved. Furthermore, since the touch electrode is also used as an electrode (e.g., cathode) of the OLED, it is not necessary to provide separate electrodes for only touch. That is to say, the touch display panel of the embodiment is an in-cell touch display panel having advantages such as simple structure and low cost.

An embodiment of the present disclosure provides a display device including the touch display panel described above. That is to say, a display device having a display function and a touch function may be obtained by combining the touch display panel described above with other structures.

The display device may be any product or member having a display function, such as OLED display panel, electronic paper, mobile phone, tablet computer, television, display, notebook computer, digital photograph frame, and navigator.

It should be understood that, the above embodiments are merely exemplary embodiments for explaining principle of the present disclosure, but the present disclosure is not limited thereto. Various modifications and variants may be made by those ordinary skilled in the art within the spirit and essence of the present disclosure, these modifications and variants fall into the protection scope of the present disclosure.

The invention claimed is:

1. A method for manufacturing a touch display panel, comprising:
    forming a plurality of touch lines, an insulating layer and a plurality of first electrodes above a surface of a side of a substrate, the insulating layer covers the touch lines and is provided with at least one through-hole corresponding to each of the touch lines, each through-hole exposes a portion of the touch line corresponding thereto, the first electrodes arranged in rows and columns and spaced apart from each other are at a side of the insulating layer distal from the touch lines, and orthographic projections of the touch lines on the substrate do not overlap with orthographic projections of the first electrodes on the substrate;

forming barrier walls in each through-hole, and at a predetermined position, at which no touch electrode is to be formed, in an interval between the first electrodes, each of the barrier walls has a thickness greater than a predefined threshold in a direction perpendicular to the surface of the substrate;

forming a light emitting layer and a second electrode layer at the side of the substrate formed with the touch lines, the insulating layer, the first electrodes and the barrier walls, the second electrode layer is formed at a side of the light emitting layer distal from the substrate, portions of the light emitting layer formed above the barrier walls and portions of the second electrode layer formed above the barrier walls disconnect from remaining portions of the light emitting layer and remaining portions of the second electrode layer respectively;

removing the barrier walls, the portions of the light emitting layer formed above the barrier walls and the portions of the second electrode layer formed above the barrier walls, the remaining portions of the second electrode layer form a plurality of touch electrodes arranged in rows and columns and spaced apart from each other, each of the first electrodes, the light emitting layer in contact with said each of the first electrodes and the touch electrode in contact with the light emitting layer form an organic light emitting diode; and forming an electrical conductive structure in each through-hole, each electrical conductive structure couples one touch line corresponding thereto to one touch electrode corresponding to said one touch line, wherein forming the barrier walls comprises: performing and developing processes on photoresist to form the barrier walls, so that the barrier walls are formed of the photoresist, and the photoresist is photodegradable photoresist.

2. The method of claim 1, wherein removing the barrier walls comprises: applying light radiation to the barrier walls so that the barrier walls are separated from the substrate.

3. The method of claim 2, wherein
during applying the light radiation to the barrier walls, a wind shower process is further performed on the barrier walls by blowing inert gas to the barrier walls.

4. The method of claim 1, wherein the photodegradable photoresist comprises: photoresist base material and photo-degradation catalyst doped in the photoresist base material.

5. The method of claim 4, wherein
the photo-degradation catalyst is titanium dioxide.

6. The method of claim 1, wherein
each of the barrier walls has a thickness greater than or equal to 1000 nm in a direction perpendicular to the surface of the substrate.

7. The method of claim 1, wherein
the touch lines extend parallel with each other.

8. The method of claim 7, wherein
each of the rows of the first electrodes or each of the columns of the first electrodes has a direction parallel with a direction in which the touch lines extend.

9. The method of claim 8, wherein
each of the barrier walls comprises a portion extending parallel with the direction in which the touch lines extend and a portion extending perpendicular to the direction in which the touch lines extend.

10. The method of claim 9, wherein
in a cross section, perpendicular to a direction in which the barrier walls extend, of at least one of the barrier walls, the at least one of the barrier walls has a width in a direction parallel to the surface of the substrate, which increases as distant from the substrate.

11. The method of claim 1, wherein forming the electrical conductive structure in each through-hole comprises: coating metal powder in each through-hole to form the electrical conductive structure.

12. A method for manufacturing a touch display panel, comprising:

forming a plurality of touch lines, an insulating layer and a plurality of first electrodes above a surface of a side of a substrate, the insulating layer covers the touch lines and is provided with at least one through-hole corresponding to each of the touch lines, each through-hole exposes a portion of the touch line corresponding thereto, the first electrodes arranged in rows and columns and spaced apart from each other are at a side of the insulating layer distal from the touch lines, and orthographic projections of the touch lines on the substrate do not overlap with orthographic projections of the first electrodes on the substrate;

forming barrier walls in each through-hole, and at a predetermined position, at which no touch electrode is to be formed, in an interval between the first electrodes, each of the barrier walls has a thickness greater than a predefined threshold in a direction perpendicular to the surface of the substrate;

forming a light emitting layer and a second electrode layer at the side of the substrate formed with the touch lines, the insulating layer, the first electrodes and the barrier walls, the second electrode layer is formed at a side of the light emitting layer distal from the substrate, portions of the light emitting layer formed above the barrier walls and portions of the second electrode layer formed above the barrier walls disconnect from remaining portions of the light emitting layer and remaining portions of the second electrode layer respectively;

removing the barrier walls, the portions of the light emitting layer formed above the barrier walls and the portions of the second electrode layer formed above the barrier walls, the remaining portions of the second electrode layer form a plurality of touch electrodes arranged in rows and columns and spaced apart from each other, each of the first electrodes, the light emitting layer in contact with said each of the first electrodes and the touch electrode in contact with the light emitting layer form an organic light emitting diode; and forming an electrical conductive structure in each through-hole, each electrical conductive structure couples one touch line corresponding thereto to one touch electrode corresponding to said one touch line, wherein forming the electrical conductive structure in each through-hole comprises: coating metal powder in each through-hole to form the electrical conductive structure.

* * * * *